(12) United States Patent
Handshoe

(10) Patent No.: US 9,756,748 B1
(45) Date of Patent: Sep. 5, 2017

(54) REMOVABLE RACK MOUNTABLE POWER CELL

(71) Applicant: Sam Handshoe, Catlettsburg, KY (US)

(72) Inventor: Sam Handshoe, Catlettsburg, KY (US)

(73) Assignee: SMC Electrical Products, Inc., Huntington, WV (US)

( * ) Notice: Subject to any disclaimer, the term of this patent is extended or adjusted under 35 U.S.C. 154(b) by 768 days.

(21) Appl. No.: 14/033,016

(22) Filed: Sep. 20, 2013

Related U.S. Application Data

(60) Provisional application No. 61/703,459, filed on Sep. 20, 2012.

(51) Int. Cl.
| | |
|---|---|
| *H02B 11/02* | (2006.01) |
| *H05K 5/02* | (2006.01) |
| *H02B 11/28* | (2006.01) |
| *H02B 11/00* | (2006.01) |
| *H02B 11/10* | (2006.01) |

(52) U.S. Cl.
CPC ........... *H05K 5/0247* (2013.01); *H02B 11/00* (2013.01); *H02B 11/02* (2013.01); *H02B 11/10* (2013.01); *H02B 11/28* (2013.01)

(58) Field of Classification Search
CPC .......................................... H02B 11/00–11/28
See application file for complete search history.

(56) References Cited

U.S. PATENT DOCUMENTS

| | | | |
|---|---|---|---|
| 2,554,510 A | 5/1951 | Spicer | |
| 2,982,827 A | 5/1961 | Goetz | |
| 3,274,356 A | 9/1966 | Godfrey | |
| 3,716,684 A | 2/1973 | McMillen | |
| 3,896,353 A | 7/1975 | Burton | |
| 4,482,936 A | 11/1984 | Saito | |

(Continued)

OTHER PUBLICATIONS

Line Power, Vacuum Circuit Breakers and Feeder Protectors, retrieved on Oct. 21, 2013, retrieved from http://linepower.com/products/Circuit%20Brekaers%20and%20Feeder%20Protectorts/circ . . . , 7 pages.

(Continued)

*Primary Examiner* — Ramon M Barrera
(74) *Attorney, Agent, or Firm* — Phyllis K Wood; PK Wood Law Office

(57) ABSTRACT

A removable electrical power cell including an incoming electrical source connector with a circuit interrupting device and an electrically isolated outgoing electrical load connector, an electro-mechanical switching assembly connected to a movable disconnect switch to move the disconnect switch between an open and grounded position and a closed and energized position and a controller to provide an input signal for controlling the operation of the electro-mechanical switching assembly to control an operation of the removable electrical power cell. The electro-mechanical switching assembly includes a rack and pinion switching assembly and a lockout limit switch to control operation of the automatic power switching assembly. The electro-mechanical switching assembly including a motor driven switching assembly to automatically open and close the high voltage power isolation switch based on an incoming signal. The motorized removal power cell including a lock out assembly to prevent removing the power cell when closed and energized.

7 Claims, 18 Drawing Sheets

(56) References Cited

U.S. PATENT DOCUMENTS

| | | | |
|---|---|---|---|
| 6,031,192 | A | 2/2000 | Liebetruth |
| 6,127,742 | A | 10/2000 | Weynachter |
| 6,169,653 | B1 | 1/2001 | Engel |
| 8,760,853 | B1* | 6/2014 | Bullock .............. H02B 11/04 200/50.21 |
| 2010/0157512 | A1* | 6/2010 | Yee et al. .............. H02B 1/36 361/614 |

OTHER PUBLICATIONS

Federal Pacific, MAVRiC: Vacuum Fault Interrupters, 2012, retrieved on Oct. 23, 2013, retrieved from http://www.federalpacific.com/literature/sgear/PC-11A-310.pdf, 8 pages.

Federal Pacific, Auto-jet Loadbreak Switches, retrieved on Oct. 23, 2013, retrieved from http://www.federalpacific.com/productcart/pc/viewPrd.asp?idcategory=17&product=26, 4 pages.

Cutler Hammer, Type PSI/II Padmount Switchgear, 1998, 11 pages.

Sunbelt Transformer, Type PSI/II Pad-Mount Switchgear: Instructions for Installation and Operation, 2006, 16 pages.

Line Power, DTS Down Time Saver, retrieved on Oct. 21, 2013, retrieved from http://linepower.com/literature/pdf/LPMS-DTS.pdf, 3 pages.

Line Power, DTS Down Time Saver, retrieved on Oct. 21, 2013, retrieved from http://www.federalpacific.com/literature/lineup/LPMS-DTS-0606.PDF, 2 pages.

Circuit Interruption Techniques, Advantages of Federal Pacific Circuit Interruption Technique, Switchgear Components, 2004, 30 pages.

Schneider Electric, Type HVL Load Interrupter Switch, Instruction Bulletin, 1993-2005, 20 pages.

Rockwell Automation, Technical Data, Draw-out Versus Fixed Mounted Contactors, 2002, 4 pages.

S&C Mini-Rupter Switches: Indoor Distrubution (4.16 kv through 25 kv), Instructions for Installation, 1982, 12 pages.

Metal-Enclosed Switchgear Indoor and Outdoor Distribution 5kV through 38 kV, Metal-Enclosed Switchgear—Advantages, 2009, retrieved from http://www.federalpacific.com/literature/sgear/09manualmetalenc.pdf, 11 pages.

General Electric, IC7160 Limitamp: Controllers with Draw-out Vacuum Contactor, Instructions, 1983, 10 pages.

Powell, Class E2 Medium-Voltage Controllers with Drawout Vacuum Contactors, Instructions, 2004, 48 pages.

Siemens, 5kV and 15kV Vacuum Circuit Breakers Type GMI, Instruction, Installation, Operation, Maintenance, SG-3268-01, 46 pages.

SAIT Mining SA—User Manual CPS 3.3kV, 1998, 22 pages.

Cutler-Hammer, Motor Control Assemblies Medium Voltage Starters (AMPGARD), 2001, 7 pages.

Cutler-Hammer, Medium-Voltage Distribution Equipment Metal-Clad Switchgear—Drawout Vacuum Breakers (VCP-W), 2001, 20 pages.

Cutler-Hammer, DS/DSII Low Voltage Switchgear Renewal Parts, 1998, 20 pages.

Cutler-Hammer, Type DSII Metal-Enclosed Low Voltage Switchgear, Technical Data, 2000, 48 pages.

Westinghouse, Receiving, Operation, Maintenance, Instructions De-ion Air Circuit Breaker, Type DH, Horizontal Drawout Infoor and Outdoor Service, 1953, 70 pages.

Westinghouse, Standardized Metal-Clad Switchgear, with type DH Magnetic De-ion Air Circuit Breakers, 1961.

Westinghouse, Instructions for Type VCP Vacuum Circuit Breakers, 1982, 29 pages.

Powercon Corp, Instruction Book, Horizontal Drawout Metal-Clad Switchgear with Westinghouse Vacuum Circuit Breakers, 1990, 16 pages.

Powell Apparatus Service, Specification for Westinghouse DHP Circuit Breakers, 2004, 7 pages.

VersaRupter Family, Installation/Maintenance Instructions, 2002, 26 pages.

* cited by examiner

SECTION A-A
SCALE 1.5

REMOVABLE RACK MOUNTABLE POWER CELL

This applicant claims the benefit of priority to U.S. Provisional Application No. 61/703,459 filed on Sep. 20, 2012.

FIELD OF THE INVENTION

This invention relates to rack mountable electrical equipment and, in particular, to methods, systems and devices for a removal motor power cell for bolt in rack mounted electrical equipment using motorized mechanical switching for connecting and disconnecting high voltage electrical power via an automatic or remotely operated power switching assembly coupled with the motorized mechanical switching.

BACKGROUND

A complete 5 KV motor circuit includes power components relating the 5K volt rack mounted power cell and low voltage control protective relaying which include a ground fault relay, ground wire monitor, short circuit and overload relays. The prior art 5 KV pull out cells use a single draw out assembly consisting of both power and control components. As a result, when one of the power or the control components fails, both of the components are required to be replaced at an added expense.

U.S. Pat. No. 7,277,294 describes a contactor draw out tray that has a movable frame and a stationary frame which carries the electrical components for an electrical feeder circuit and has input terminals for the incoming electrical power and output terminals for delivering electrical power to equipment operating on the feeder circuit. The movable frame carries the contactors. A disconnect mechanism locks the movable frame relative the stationary frame and provides a primary mechanical means for disengaging electrical current flow through the apparatus. While the contactor draw out tray provides access for repairs, the operator is required to stand in front of the device to mechanically disengage the electrical current flowing between the input and output terminal before the tray can be drawn out for repairs.

An earlier draw out fused switch gear assembly is taught in U.S. Pat. No. 3,274,356. The assembly is adapted to be removably engageable with fixed electrical connectors from a electrical source. Another early patent, U.S. Pat. No. 2,982,827, describes an interlocking mechanism for use with a slidably mounted electrical draw out unit for forward and backward movement between an advanced and a retracted position in which movable contacts of the high voltage supply source that mate with stationary source.

Other prior art patents include U.S. Pat. No. 6,169,653 issued Jan. 2, 2001 which teaches a latch and locate cradle; U.S. Pat. No. 6,127,742 issued Oct. 3, 2000 describes a draw-out electrical switchgear apparatus; U.S. Pat. No. 6,031,192 issued Feb. 29, 2000 describes a draw out circuit breaker with disconnect position interlock mechanism; U.S. Pat. No. 4,482,936; U.S. Pat. No. 3,896,353; U.S. Pat. No. 3,716,684; and U.S. Pat. No. 2,554,510.

To solve the problems associated with the prior art draw out cells, the methods, systems and apparatus of the present invention separate the power components which seldom need to be replaced from the protective relaying control components which have a much higher failure rate.

SUMMARY OF THE INVENTION

A primary objective of the present invention is to provide methods, systems and devices for a modular quick change out power cell to reduce downtime, increase circuit capacity all in a very compact design with increased safety to mine personnel.

A secondary objective of the present invention is to provide methods, systems and devices for a complete 5 KV motor circuit is made up of power components (5 KV Cell) and low voltage control protective relaying which include a ground fault relay, ground wire monitor, short circuit and overload relays.

A third objective of the present invention is to provide methods, systems and devices for separating the power components which seldom need to be replaced from the protective relaying which have a much higher failure rate.

A fourth objective of the present invention is to provide methods, systems and devices for individual draw out and bolt in protective relaying such that customers have the ability to have a quick change out of either the power component or the control component without the necessity of changing all components. The maximum control power voltage in the protective relay compartment is 120 VAC, thereby allowing easier troubleshooting and replacement since 5 KV power circuits require a higher level of isolation protocol to be followed when exposing personnel to those circuits.

A first embodiment provides a removable electrical power cell that includes a power cell housing removably connected with an enclosure frame assembly, an incoming electrical source connector and an outgoing electrical load connector on a back panel of the power cell housing, the incoming electrical connector connected with a circuit interrupting device and electrically isolated from the outgoing load electrical connector, a disconnect switch movable between a first connector and a second connector, an electro-mechanical switching assembly connected to the movable disconnect switch to move the disconnect switch into contact with one of the first connectors in an open and grounded position and second connector in a closed and energized position, the second connector connected to an opposite end of the circuit interrupter, and a controller to provide an input signal for controlling the operation of the electro-mechanical switching assembly to control an operation of the removable electrical power cell.

The electro-mechanical switching assembly can include a motor for moving the disconnect switch between the first and the second connectors and a rack and pinion assembly connected with the motor and movable between an upper and a lower limit switch to limit the operation of the motor to move the disconnect switch between contact with the first and the second connectors. The disconnect switch can be a rotatable switch blade rotatable by a shaft rotated by the motor, the shaft rotating the pinion for moving a rack moving assembly between the upper and the lower limit switches.

The removable power cell can include a lock out assembly coupled with the rack and pinion assembly to prevent removal of the power cell when the rotatable disconnect switch is in the closed and energized position. The front plate can have a window for viewing the disconnect switch, the front plate connected with the frame assembly. The removable power cell can include a visual status indicator on the front late to show a status of the power cell. The controller can include a cable between an interface connector connected with the removable power cell and a remote operator to allow the remote operator to initiate operation of the electro-mechanical switching assembly from a distance.

The electro-mechanical switching assembly can be a movable motorized switching assembly to automatically connect and disconnect the incoming electrical source connector from the first and second connectors and the outgoing load connector based on the input signal.

A second embodiment provides a removable motor power cell that includes a bolt-in assembly connected with an enclosure frame, a motorized mechanical switching assembly attached to the bolt-in assembly to connect and disconnect electrical power to the electrical enclosure and a power switching assembly attached to the bolt-in assembly and coupled with the motorized mechanical switching assembly to open and close a high voltage isolation switch in one of an open and grounded position and a closed position, the motorized mechanical switching assembly controlling an operation of the high voltage power isolation switch. The mechanical switching assembly can be a rack and pinion switching assembly connected with a closed auxiliary limit switch and an open auxiliary limit switch and a lockout limit switch to control operation of the power switching assembly.

The power switching assembly can be a motor driven switching assembly to automatically open and close the high voltage power isolation switch based on a position of the rack and pinion switching assembly. The power switching assembly can be an automatic power switching assembly attached to the bolt-in assembly and coupled with the mechanical switching assembly to open and close a high voltage isolation switch in one of an open and grounded position and a closed position. The power switching assembly can be a remote operated power switching assembly attached to the bolt-in assembly and coupled with the mechanical switching assembly to open and close a high voltage isolation switch in one of an open and grounded position and a closed position, A third embodiment provides A motorized removable electrical power cell that includes a power cell housing to removably attach to an enclosure frame assembly, an incoming electrical source connector and an outgoing electrical load connector on a back panel of the power cell housing, the outgoing electrical load connector electrically isolated from the incoming electrical source connector, an electro-mechanical switching assembly connected to moving frame assembly, a mating second incoming electrical source connector and a mating second outgoing electrical load connector connected to the moving frame assembly aligned to mate with the incoming electrical source connector and an outgoing electrical load connector on the back panel, the electro-mechanical switching assembly moving the frame assembly into a closed and energized position and a controller to provide an input signal for controlling the operation of the electro-mechanical switching assembly to control an operation of the motorized removable electrical power cell.

The motorized removable electrical power cell can include a circuit interrupter connected to the moving frame assembly between the mating second incoming electrical source connector and the mating second outgoing electrical load connector. The electro-mechanical disconnect switch can be a motor connected with a gear box to move the moving frame assembly between the closed and energized position and an open and grounded position.

Further objects and advantages of this invention will be apparent from the following detailed description of preferred embodiments which are illustrated schematically in the accompanying drawings.

DESCRIPTION OF THE PREFERRED EMBODIMENTS

Figure 1:
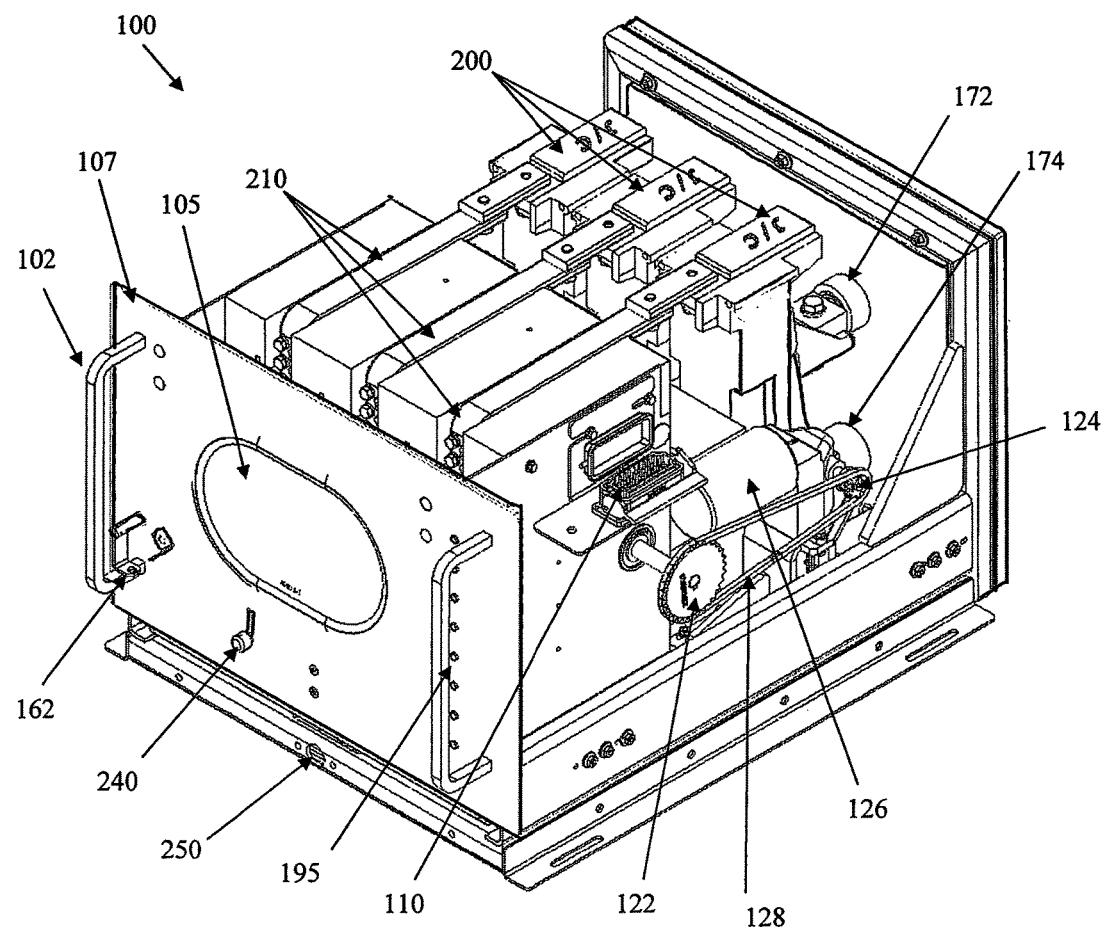
FIG. 1 is right side perspective view of a high voltage removable power cell according to an embodiment of the invention in a closed position.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of reference numerals used in the description and the drawings to identify components:
100 removable motor power cell
102 handle
105 window
107 front panel
110 controller signal connector
120 motor assembly
122 large sprocket 124 small sprocket
126 motor
128 sprocket chain
130 shaft between large sprocket and rack
135 actuator
140 rack and pinion assembly
142 rack
144 pinion
146 rack pinion moving assembly
148 switch bracket
152 lock out micro switch
154 upper limit switch (open and grounded)
156 lower limit switch (closed and energized)
160 lock out assembly
162 lock out lever—rotatable
164 lock out shaft
170 rear contact panel
172 upper contact (incoming)
174 lower contact (outgoing)
176 upper multi-fork (incoming)
177 incoming power blade
178 lower multi-fork (outgoing)
179 outgoing power blade
195 visual status indicators
200 circuit interrupter
210 bus bar
220 visible disconnect switch
230 multi-fork connector (closed and energized)
232 multi-fork connector (outgoing load)
235 multi-fork connector (open and grounded)
237 grounding blade
239 multi-fork grounding connector
240 mechanical interlock assembly
250 main bolt
260 shutter
270 gear box
275 track
280 stationary frame The present invention provides a modular quick change out power cell to reduce down time and increase circuit capacity in a very compact design with improved safety to personnel. Although the high voltage power cell of the present invention can be used in a variety of different industrial applications, the following description relates to the use of the power cell in the mining environment. The description and the drawings show examples of removable motor power cells that can be configured for use corresponding to the industry, such as a draw out tray assembly or a bolt in power cell connected directly to an enclosure frame.

A complete high voltage motor circuit is made up of power components (referred to as the power cell) and low voltage control protective relaying components which include a ground fault relay, ground wire monitor, and short circuit and overload relays are located remote from the removable motor power cell in communication with the removable motor power cell via cabling. The configuration of the present invention separates the power components which need to be replaced less often from the protective relaying components which have a much higher failure rate.

The methods, systems and devices of the present invention provide a compact electro-mechanical motorized visible disconnect power cell that can be automatically or remotely operated. Another advantage of the present invention is development of individual removable protective relaying cells that give the customer the ability to quickly change out either the power component or the control components in the protective relay compartment without the necessity of needing to replace both compartments. The maximum control power voltage in the protective relay compartment is typically 120 VAC, thereby allowing easier troubleshooting. Conversely, replacement of the high voltage power circuit requires a higher level of isolation protocol to be followed when exposing personnel to the high voltage circuits.

In the embodiment shown and described, the power components are sized for 600 amps using vacuum contactors, although they can alternatively be sized, for example for 900 amps or for 300 amps, and can be packaged into a bolt in power cell or a draw out tray assembly that is plugged into a stationary docking station fitted with female receptacles. Those skilled in the art of power distribution will understand that the scope of the invention is not limited to a particular voltage or current, and can be used for power distribution units of different voltages and different number of phases.

Prior art manually operated switches require that the operator have their hands on the switch assembly when operating which also positions them directly in front of the power isolation switch which is not ideal due to a possible arc flash condition if one of the vacuum contactor bottles has failed in the stuck closed position. To solve the problems associated with the prior art power cells, the present invention provides an electro-mechanical switching assembly that can be remotely operated with the operator a safe distance from the power cell.

FIG. 1 is right side perspective view of a high voltage removable power cell according to an embodiment of the invention in a closed position. The front panel 107 of the power cell includes a window 105 to view the visible disconnect blades and below the window 105 is a rotatable lockout lever knob 162 and a mechanical interlock 240. The front panel also includes plural visual indicators 195 and cover handles 102 on each side for pulling the removable motor power cell 100 from the equipment rack.

Figure 10:
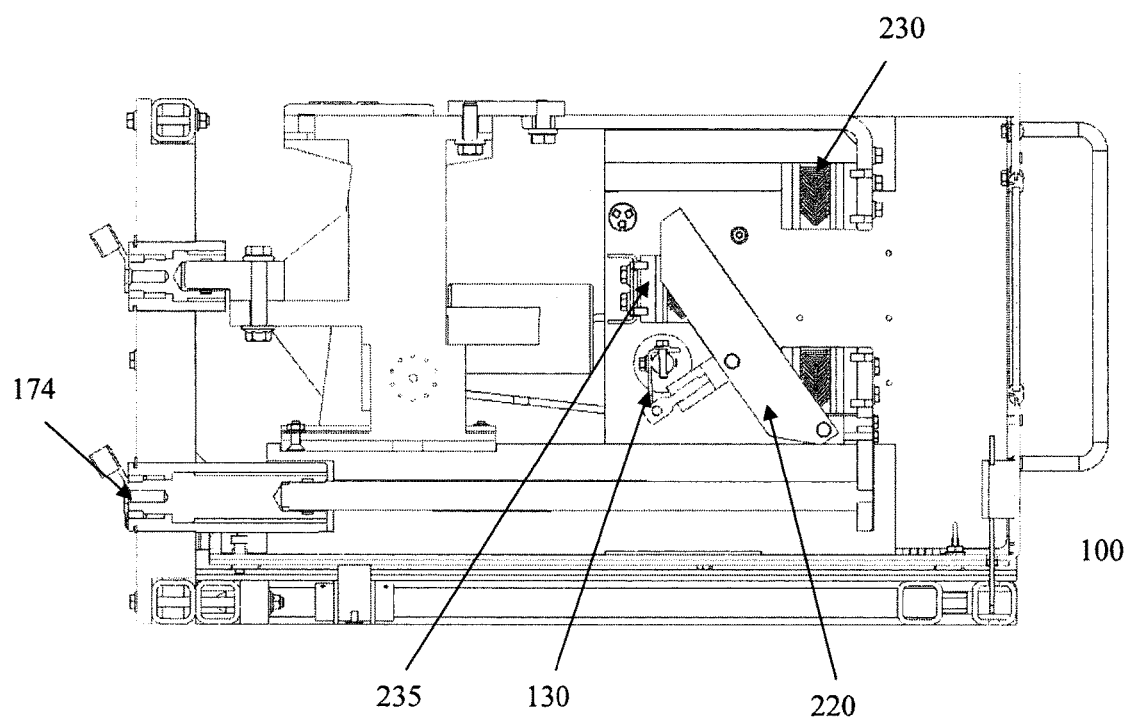
FIG. 10 is a left side view of the with the rack and pinion assembly removed to show the operation of the visible disconnect switch blades in an open and grounded position.

The removable motor power cell 100 includes a remotely located and protective relaying cell that interface with the removable motor power cell 100 via a controller connector 110 for initializing the vacuum contactors 200 and controlling the motorized rack pinion assembly for engaging and disengaging of the visual disconnect switch blades 220 between the closed and energized position (FIG. 7) and the open and ground position (FIG. 10). As shown, the motorized rack and pinion assembly 140 includes a motor 126 that is turned on and off from the remotely operated controller (not shown) that sends and receives control signals via the controller signal multi-contact connector 110. The controller signal connector 110 also provides power to the motor assembly 120.

Figure 2:
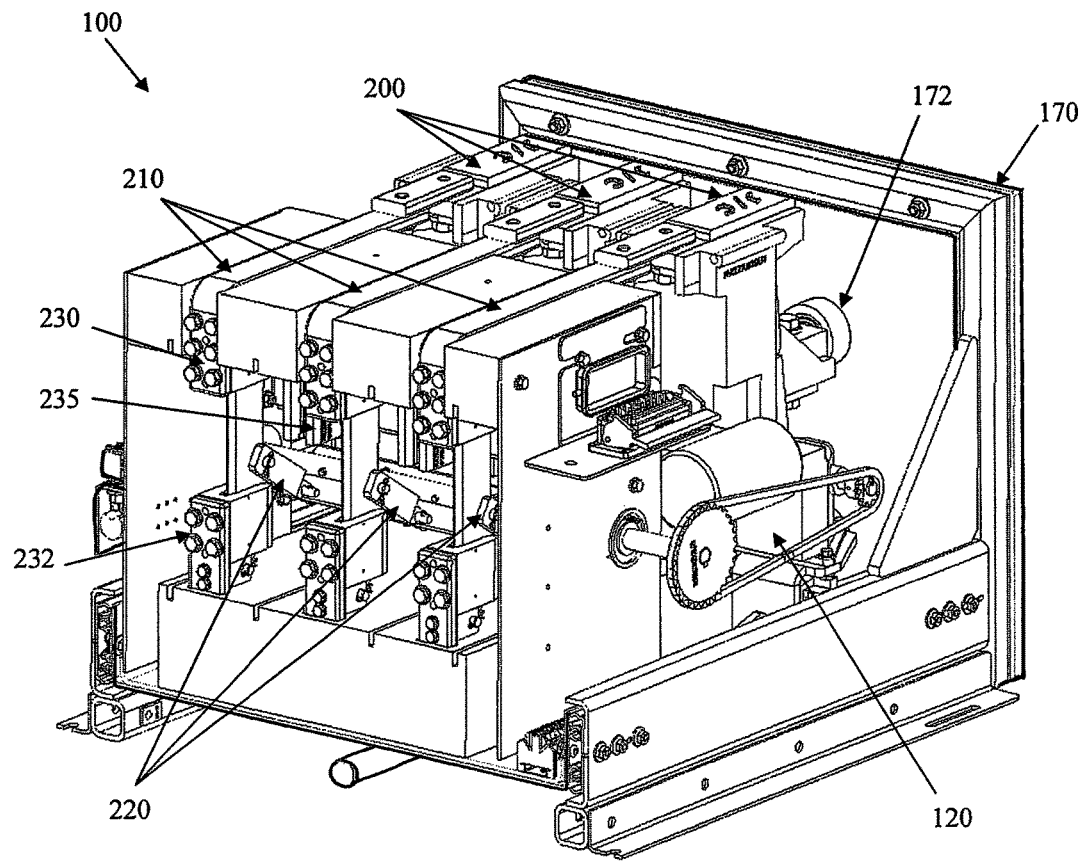
FIG. 2 is a right side section view of the power cell shown in FIG. 1 showing the visible disconnect switch.
Figure 3:
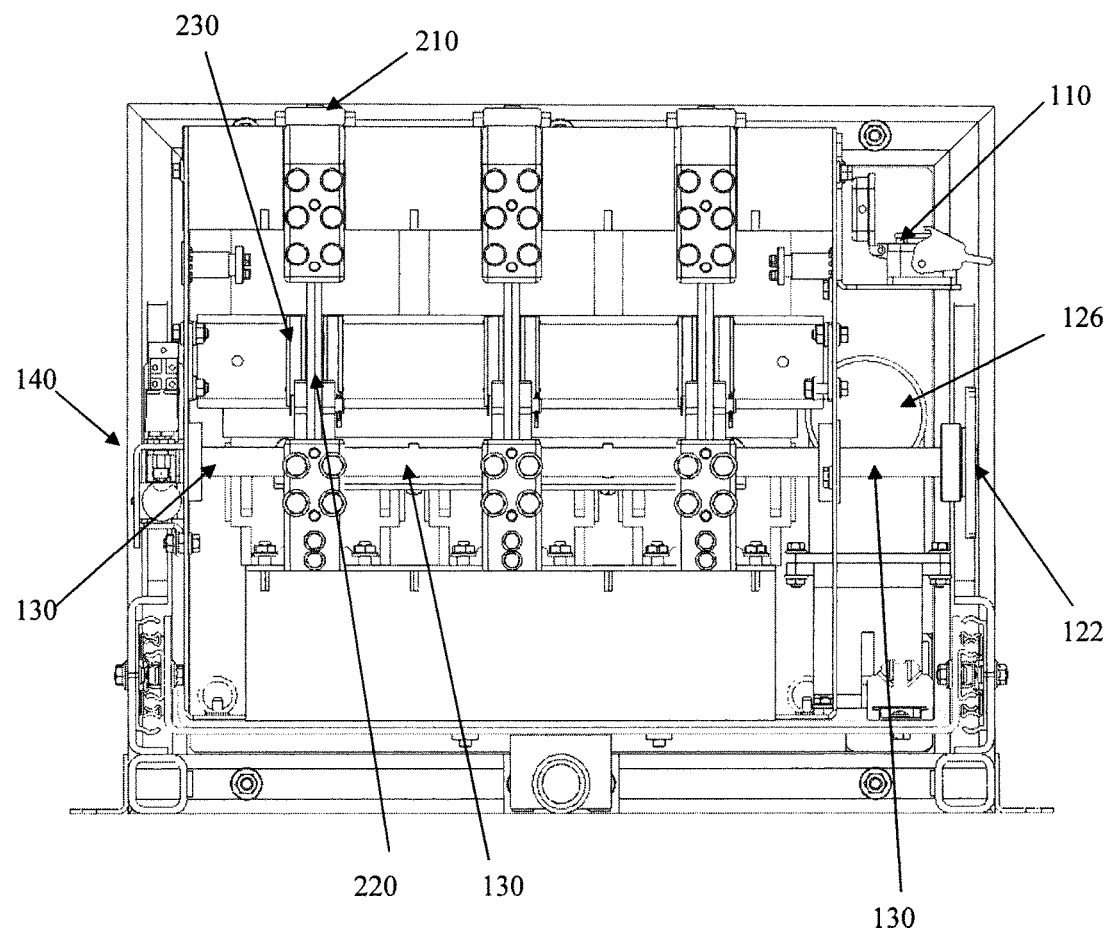
FIG. 3 a front view of the removable power cell shown in FIG. 2.
Figure 7:
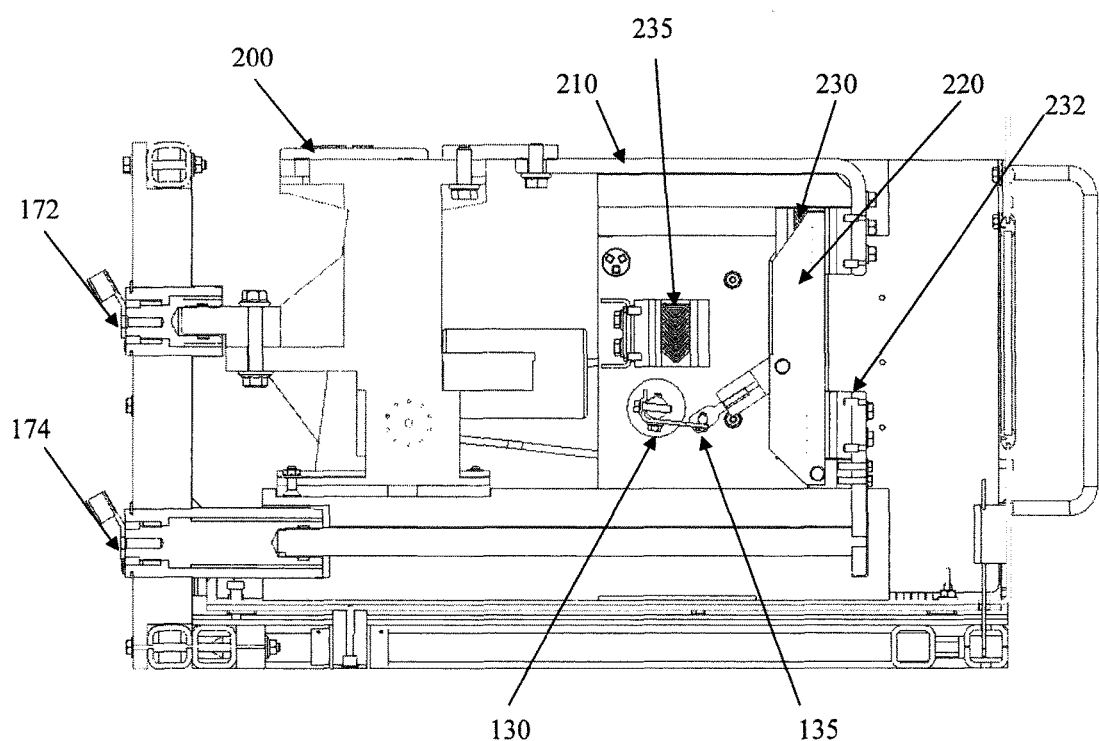
FIG. 7 is a left side view of the with the rack and pinion assembly removed to show the operation of the visible disconnect switch blades in a closed and energized position.

FIG. 2 is a right side section view of the power cell 100 shown in FIG. 1 showing the visible disconnect switch 220 and FIG. 3 a front view of the removable power cell shown in FIG. 2 with the front plate removed to show the visible disconnect switch 230. The rear contact panel 170 includes an upper row of incoming voltage contacts 172 and a lower row of outgoing contacts 174 shown in FIG. 1. The upper row of incoming voltage contacts 172 are electrically isolated from the lower row of outgoing contacts 174. When the visible disconnect switch blades 230 are in a closed position as shown in FIG. 7, the upper incoming voltage contacts 172 that connect with the vacuum interrupters 200. The current passes through the vacuum interrupters 200, across the copper bus bar 210 to the upper multi-fork connector 230. The visible disconnect switch 220 is rotated between a closed and energized position shown in FIG. 3 and an open and grounded position shown in FIG. 2. The electro-mechanical motorized rack and pinion assembly rotates the visible disconnect switch blades between the two positions.

Figure 4:
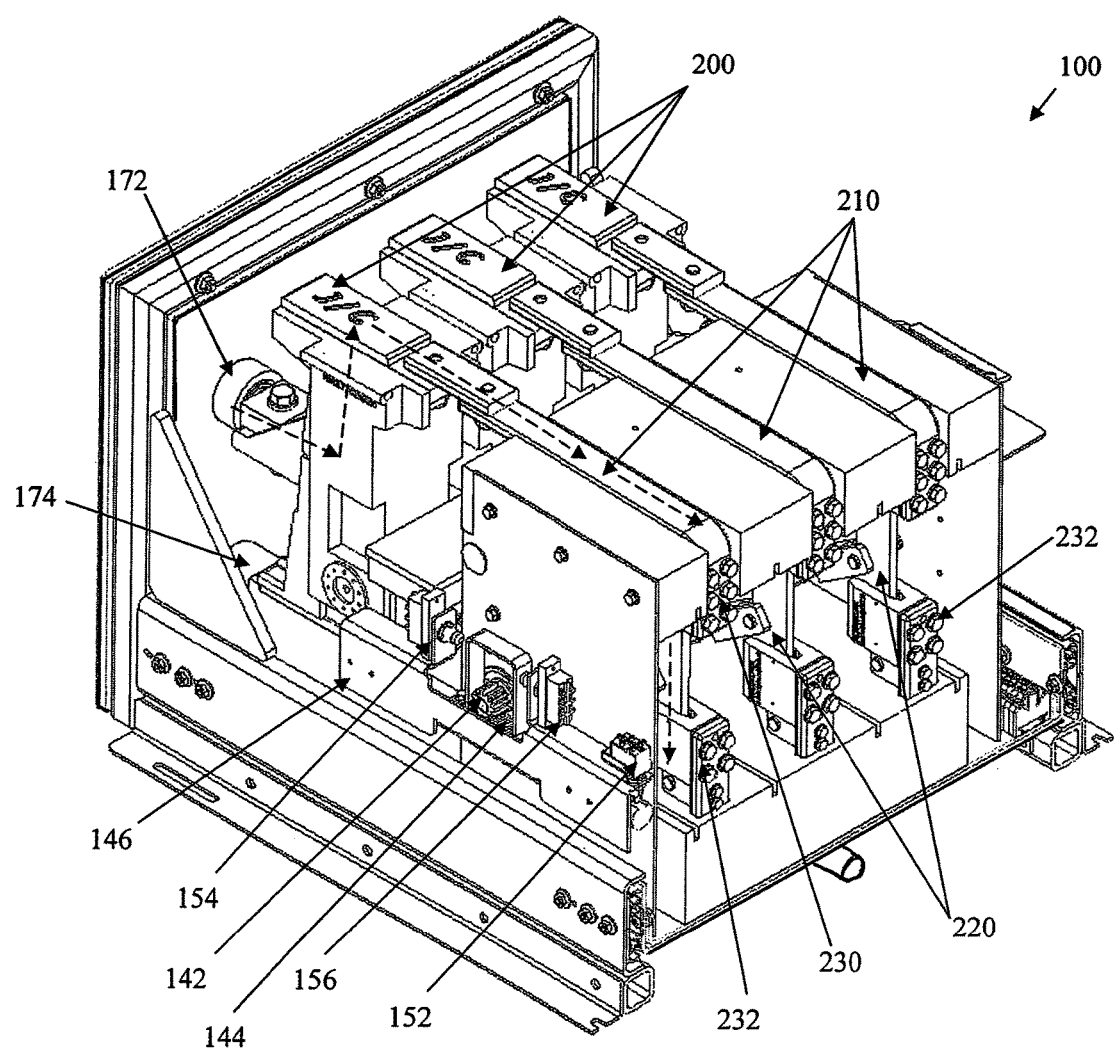
FIG. 4 is left side perspective section view of the high voltage removable power cell shown in FIG. 2.

FIG. 4 is a perspective left side view of the high voltage removable power cell showing the rack and pinion assembly 140. The rack and pinion assembly 140 shown is used as part of the electro-mechanical automatic power switch to provide precise positioning of the visual disconnect switch 220 when in the closed position or in the open and grounded position. As shown, the rack and pinion assembly includes a rack pinion moving assembly 146 and a lockout assembly 160. The rack pinion moving assembly 140 includes a pinion 144 coupled with the large sprocket 122 of the motor assembly 120 shown in FIG. 1. The rack pinion moving assembly 140 moves between and upper limit switch 154 (open and grounded) and a lower limit switch 156 (closed and energized).

FIG. 4 shows the removable power cell 100 with the cover removed showing the remote controller signal connector 110, the vacuum contactors 200 and incoming upper power contacts 172. The example shown is for a three phase high voltage system, the three upper contacts 170 each correspond to one incoming phase of the high voltage on the line side and the lower contacts 174 correspond to load side outgoing three-phase voltage lines on the load side. As shown, the power cell can include a circuit interrupter 200 for each phase. The circuit interrupter can be a vacuum interrupter 200 as shown, a circuit breaker or other type of interrupter selected for the application.

Referring to FIG. 1 in conjunction with FIG. 4, the motor 126 is automatically energized via remote signaling. The motor 126 rotates a small sprocket 124 which turns the large sprocket 122 coupled with the small sprocket 124 with a sprocket chain 128. The large sprocket 122 rotates a shaft connected with the visible disconnect switch 220 and the pinion 140 on the opposite side of the removable power cell 100. As the pinion 140 rotates, the rack and pinion assembly 140 moves forward and reverse based on the rotation of the motor 126. FIG. 3 shows the shaft 130 driven by the large sprocket 122 that rotates the visible disconnect switch 220 blades and couples with the rack and pinion assembly 140.

Figure 8:
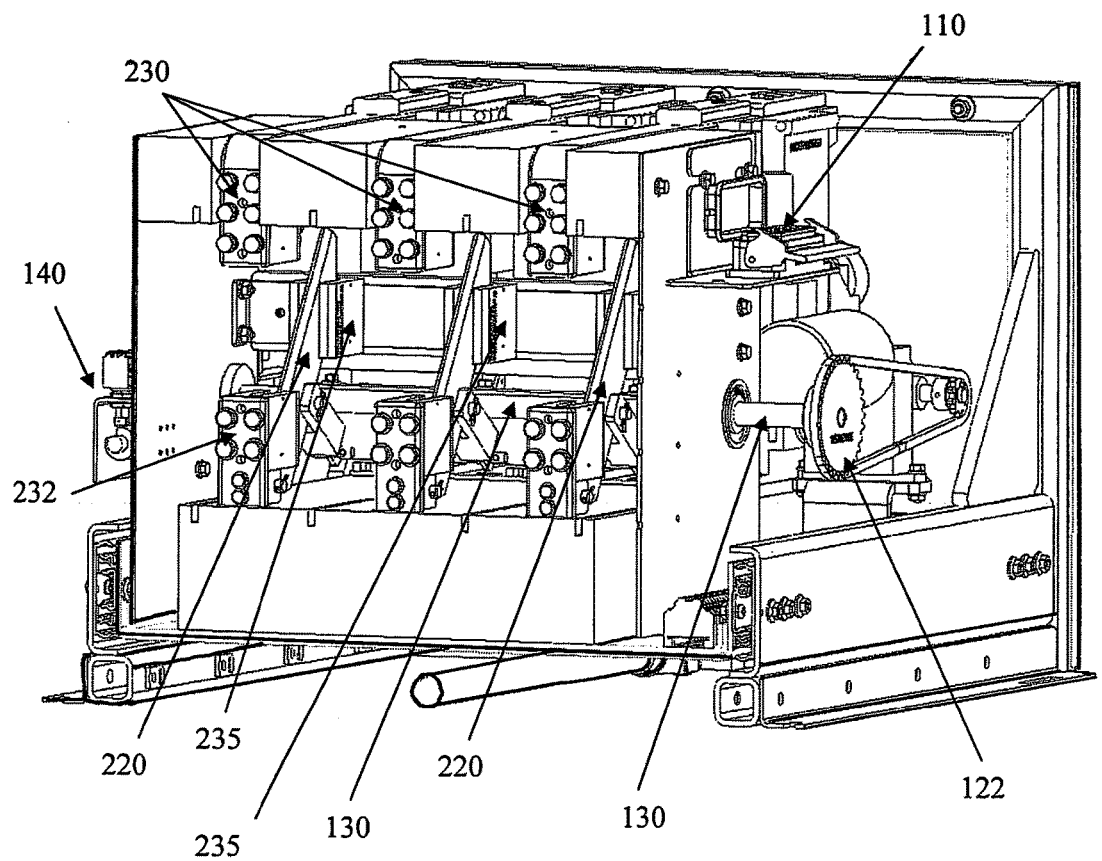
FIG. 8 is a right side section view showing the electro-mechanical operation of the visible disconnect switch blades.

In the closed and energized position shown in FIG. 4, electrical current flows from the incoming electrical source connector 172 through the vacuum interrupter 200 and since the visible disconnect switch is in the closed position, the current flow from the upper multi fork connector 30 to the outgoing multi-fork connector 232 connected with the lower outgoing contact 174 to the load. When the power cell is open ad grounded as shown in FIG. 8, the outgoing multi-fork connector 232 is switched to make contact with the lower multifork connector that connects with the grounding plane. In this position, any residual current flow from the load (outgoing contact 174) is grounded via multi-fork open and grounded connector 235.

Figure 5:
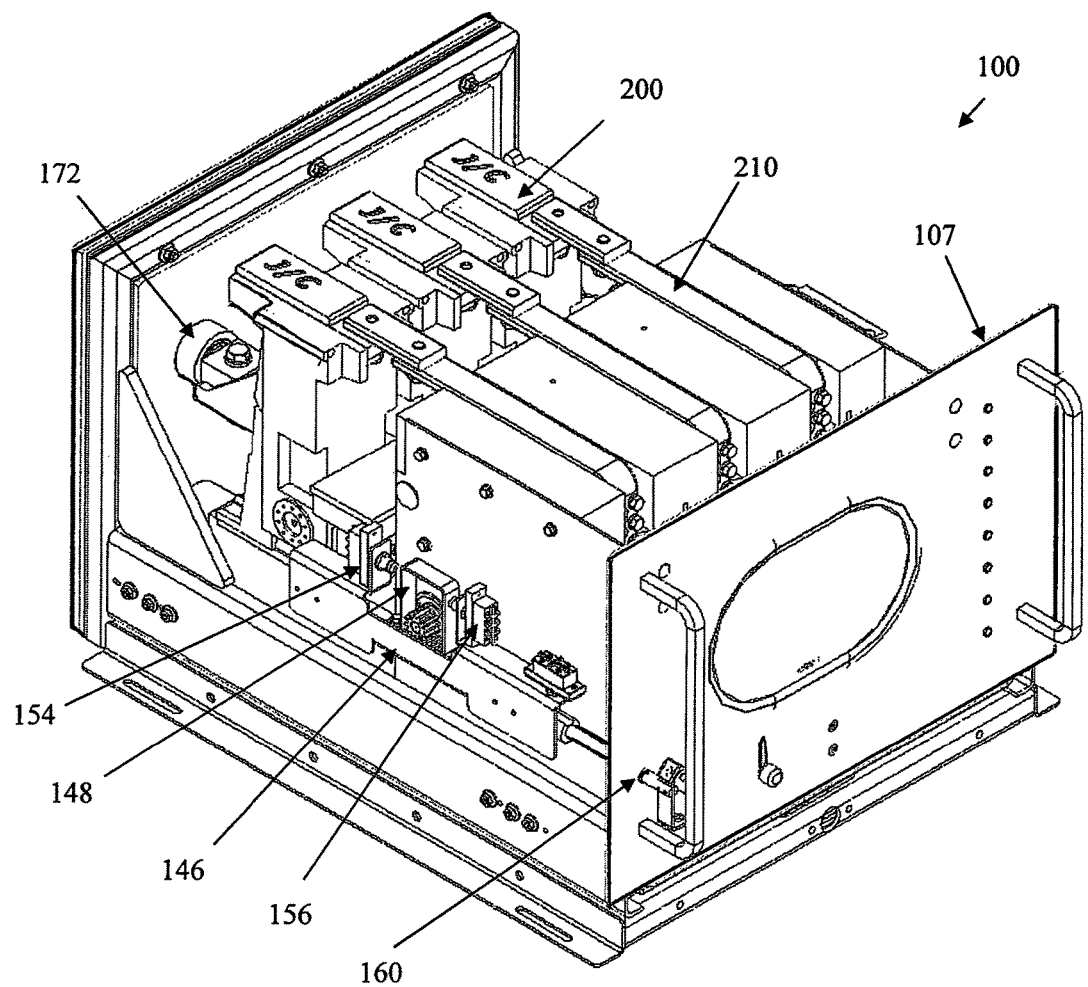
FIG. 5 is left side perspective section view of the high voltage removable power cell shown in FIG. 1.
Figure 6:
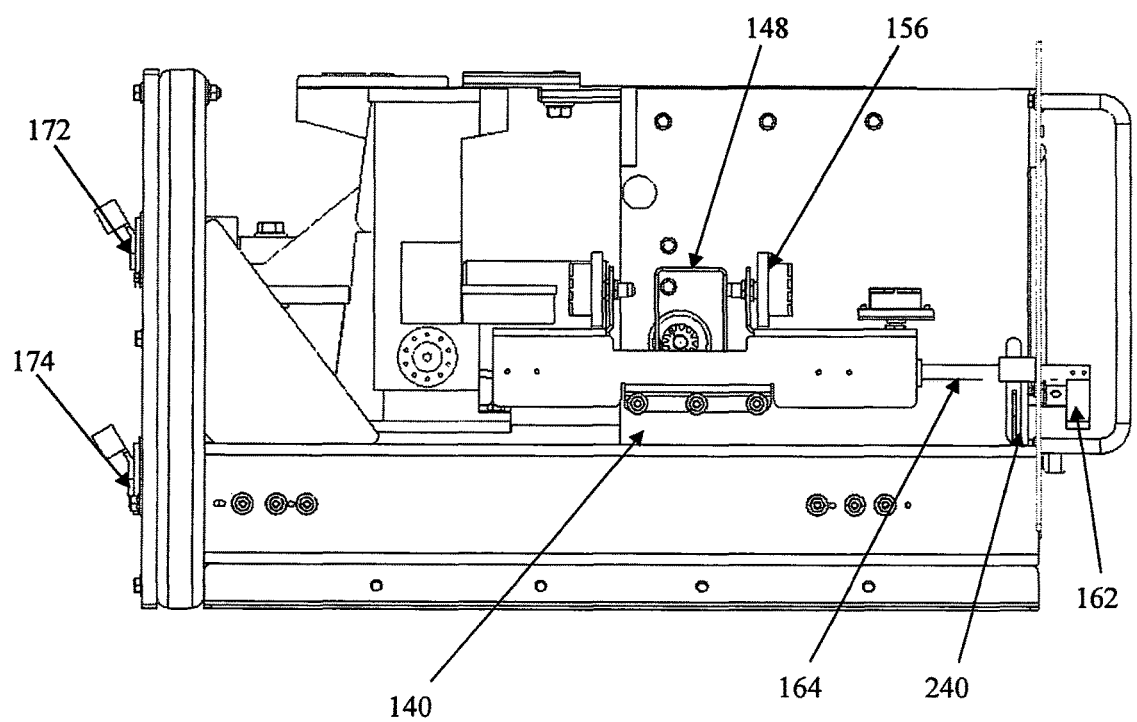
FIG. 6 is a left side view of the removable power cell showing the electro-mechanical visible disconnect rack and pinion assembly.

As shown in FIG. 5, the rack and pinion assembly includes a moving assembly 146 that connects with the lock out assembly 160 on the front of the power cell 100. The moving assembly 146 has a switch bracket 148 that moves to contact with an upper limit switch 154 and a lower limit switch 156 which correspond to the open and grounded position and the closed and energized position of the visible disconnect switch blades, respectively. In FIG. 5 the rack and pinion is shown in the closed and energized position. The upper and lower limit switches provide the signaling required for denergizing the motor 126 shown in FIG. 1.

FIG. 7 is a section view of the visible disconnect switch closed and energized multi-fork connector 230 and the open and grounded multi-fork connector 235. The motorized rack and pinion assembly rotates the shaft 130 that moves the visible disconnect switch blades 220 between the closed and energized position to the open and grounded position. An actuator 135 connects the shaft 130 to the visible disconnect switch blades 220.

Figure 11A:
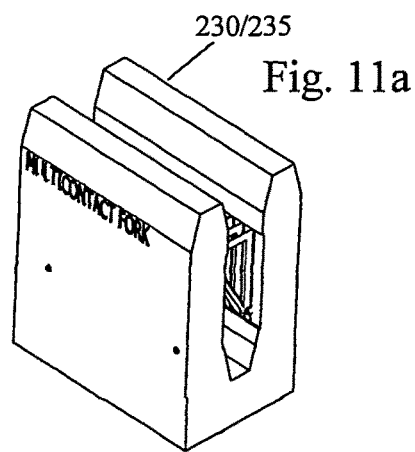
FIG. 11a is a perspective view showing an example of a multi-contact fork connector used with the visible disconnect switch.
Figure 11B:
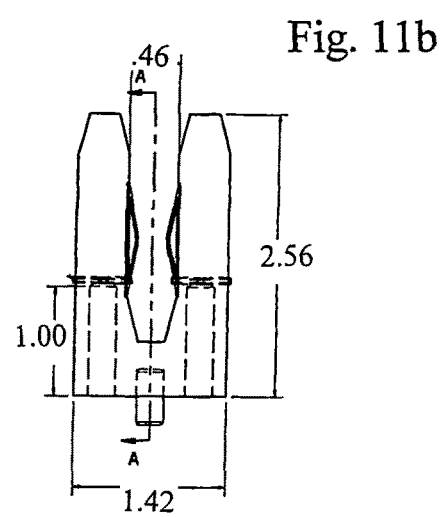
FIG. 11b shows a side view of one fork of the multi-contact fork connector.
Figure 11C:
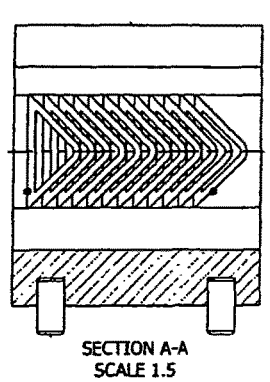
FIG. 11c is a section view showing one side of the fork body.

In the example shown in FIG. 11a is a perspective view showing an example of a multi-contact fork connector 230/235 used with the visible disconnect switch 220 shown in FIG. 2. FIG. 11b shows a side view of one fork of the multi-contact fork connector and FIG. 11c is a section view showing one side of the fork body. Referring to FIG. 4 in conjunction with FIG. 11a, to achieve the high current ratings the power switch blades of the visible disconnect switch makes contact with the upper female contact multi-contact fork 230 shown when the removable power cell is in a closed and energized position and makes contact with the lower multi-contact fork connector 235 in an open and grounded position. This female connector requires very low insertion and extraction forces while achieving a very high current carrying capability.

The multi-contact fork connector shown is manufactured by Multicontact USA, part number C3857-010 (GS9.53-LA-CUT58 Fork Assembly) and the circular contacts 172/174 are, for example, part number B4251-033 (LAMINATE LA CUD). Those skilled in the art will understand that the part numbers are for example only and that alternative connectors can be selected without deviating from the scope of the invention.

Operationally, an operator at the remote controller initiates a connect operation or disconnect operation, a corresponding incoming signal is received via the controller multi-contact connector 110 to initialize the motor 126. The motor 126 rotates the small sprocket 124 which drives the large sprocket 122 via the sprocket chain 128. The motor assembly 120 shown in FIG. 2 provides a rotating torque force from the motor assembly large sprocket 122 that is converted to a linear force for rotating the visible disconnect switch blades 220 and moving the rack pinion moving assembly 146 between the upper limit switch 154 and the lower limit switch 156. The motorized rack and pinion gearing assembly provides a 90 degree directional change in force in a very compact design of approximately two inches thick which is necessary in order to keep the overall width of the removable power cell to a minimal size. A rotating shaft between the motor large sprocket (FIG. 1) and the rotatable pinion 144 controls the movement of the rack pinion moving assembly 146.

The rack and pinion moving assembly 146 includes the rack 142 and a switch bracket 148 that travels forward and backward with the rack 142. The pinion 144 is rotated by the linear force from the motor assembly large sprocket 122 which in turn moves the rack 142 forward and back. The switch bracket 148 is attached to move with the rack 142 until the switch bracket 148 contacts with either the upper limit switch 154 or the lower limit switch 156, depending on the direction of movement.

Figure 12A:
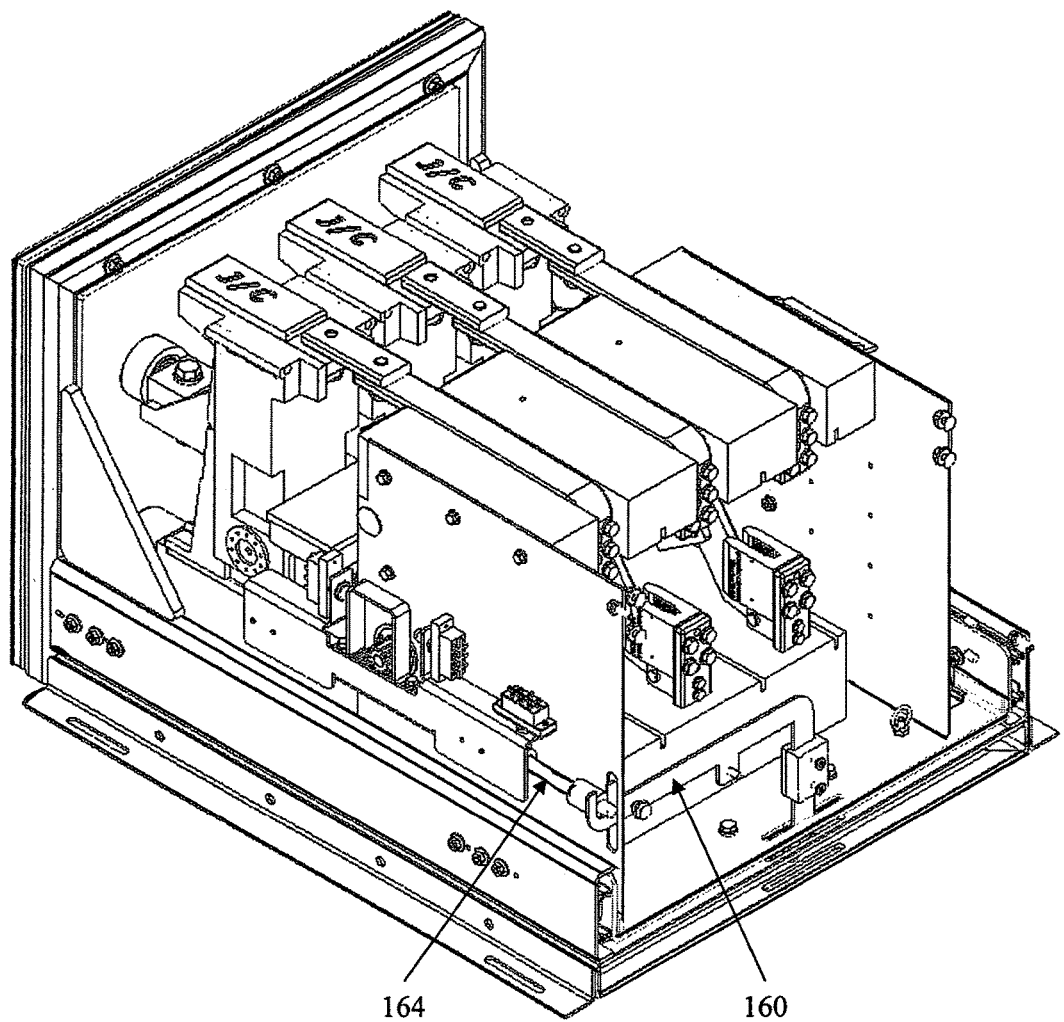
FIG. 12a is a left front perspective view of the power cell with the front panel removed showing the lock out assembly when the power cell is open and grounded with the interlock lever raised.
Figure 12B:
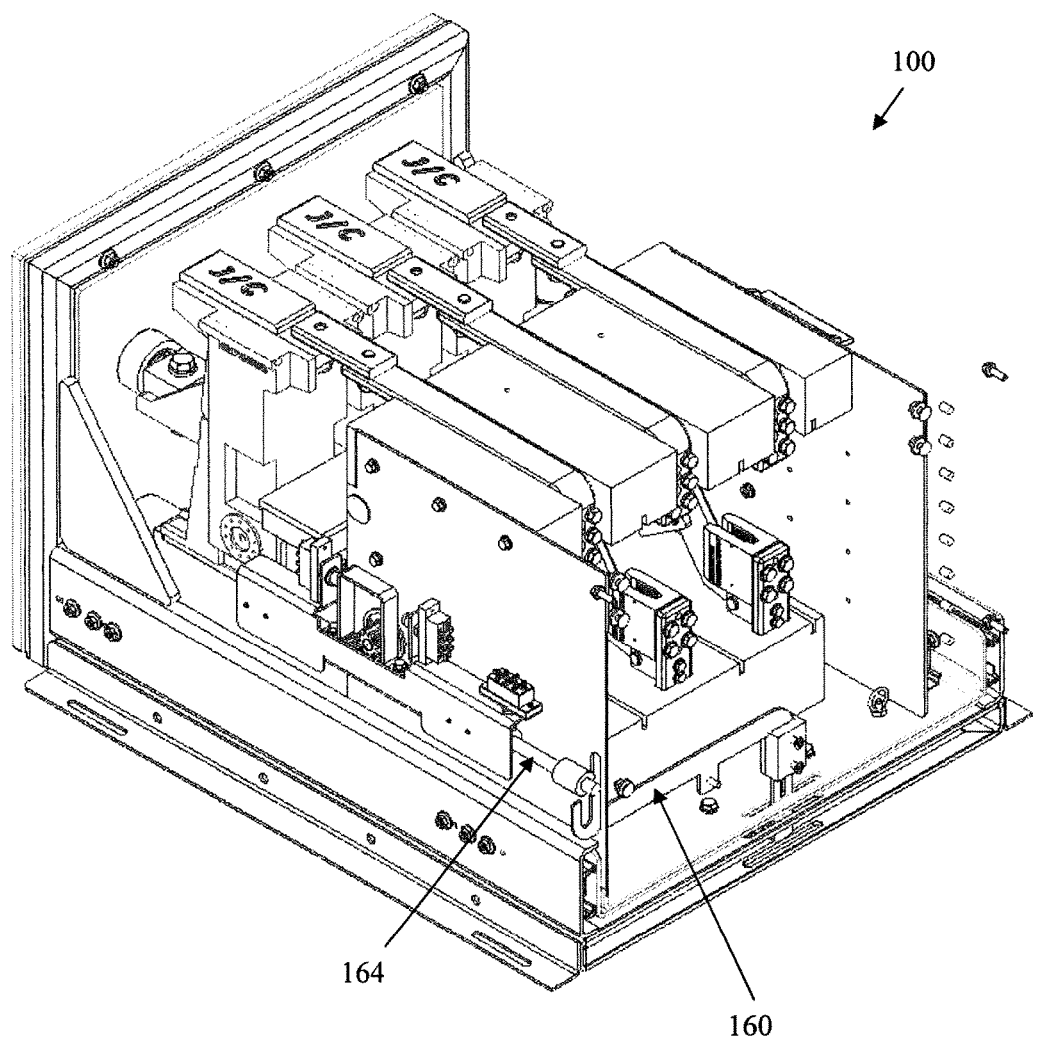
FIG. 12b is a left front perspective view of the power cell of FIG. 12a with mechanical interlock lever lowered.
Figure 12C:
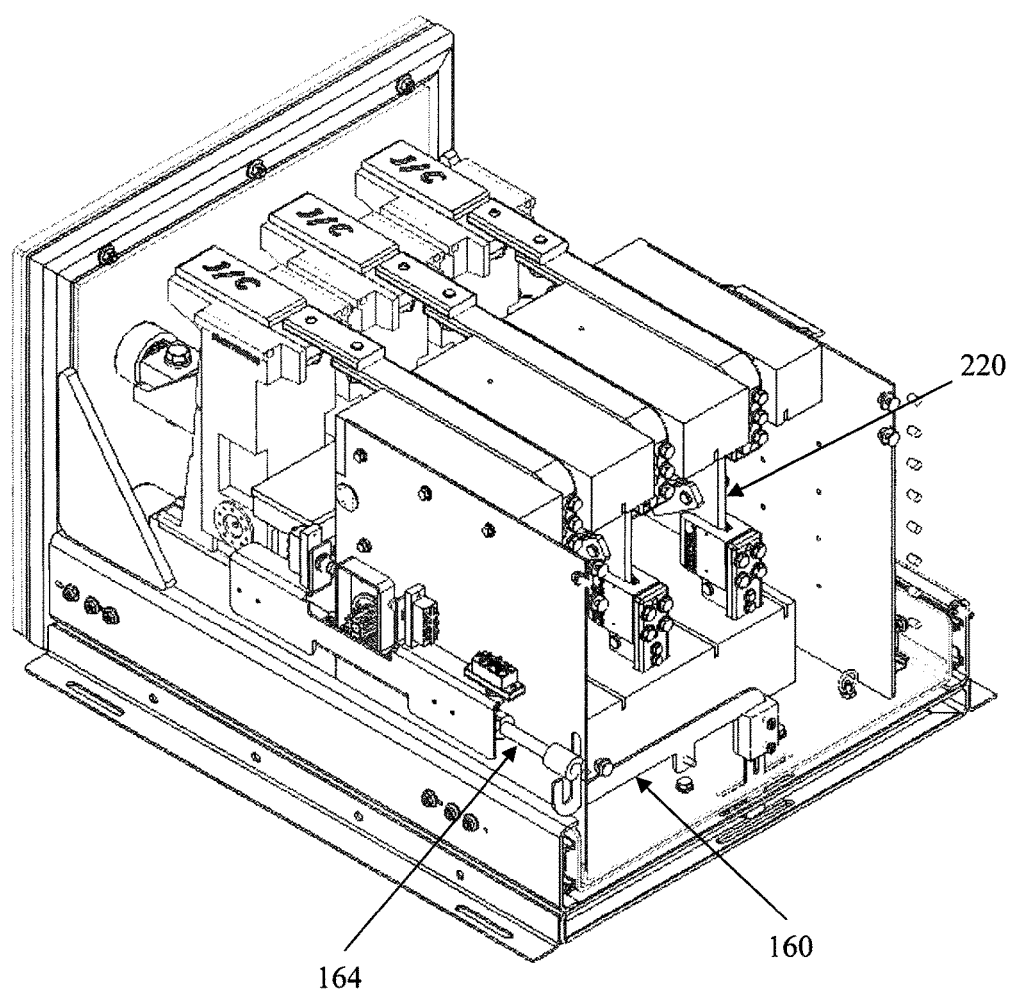
FIG. 12c is a left front perspective view of the power cell with the front panel removed showing the lock out assembly when the power cell is closed and energized.

FIG. 12a is a left front perspective view of the power cell with the front panel removed showing the lock out assembly 160 when the power cell is open and grounded position with the mechanical interlock lever 240 raised. FIG. 12b shows the lock out assembly 160 when the power cell is open and grounded position with the mechanical interlock lever 240 down. As the rack 142 moves forward and backward, the lock out shaft 164 connected with the lock out lever 162 moves forward and back. As shown in FIG. 12a, the lock out shaft interfaces with a mechanical interlock assembly 240 to prevent the removable motor power cell from being opened when the visible disconnect switch 220 is in the closed and energized position. FIG. 12c shows the switching assembly in the closed and energized position as evidenced by the visible disconnect switch blades 220.

FIG. 1 shows the lever knob of the mechanical interlock 240 such that it can only be raised when the visible disconnect switch is in the open and grounded position as shown in FIG. 12b. When the lever is raised, it allows access to the shoulder bolt 245 connected to the lock shaft 164 which is rotated to engage and disengage the draw out cell. In other words, the threaded end of the lock out shaft 164 is screwed into the main bolt 250 to lock the draw out cell and the lock shaft is rotated to disengage from the main bolt 250. When the knob 250 is released, the knob 250 returns to the down position, blocking access to the lock shaft.

One skilled in the art should realize that the particularities in the rack and pinion assembly should not be construed as limitation of the preferred embodiment. Various system configurations and corresponding components may be chosen and optimized for a particular application to achieve a desired performance and other methods to open and close the drawer and safely connect and disconnect the high voltage power to allow for safe maintenance and replacement of the high voltage draw out cell.

Figure 13:
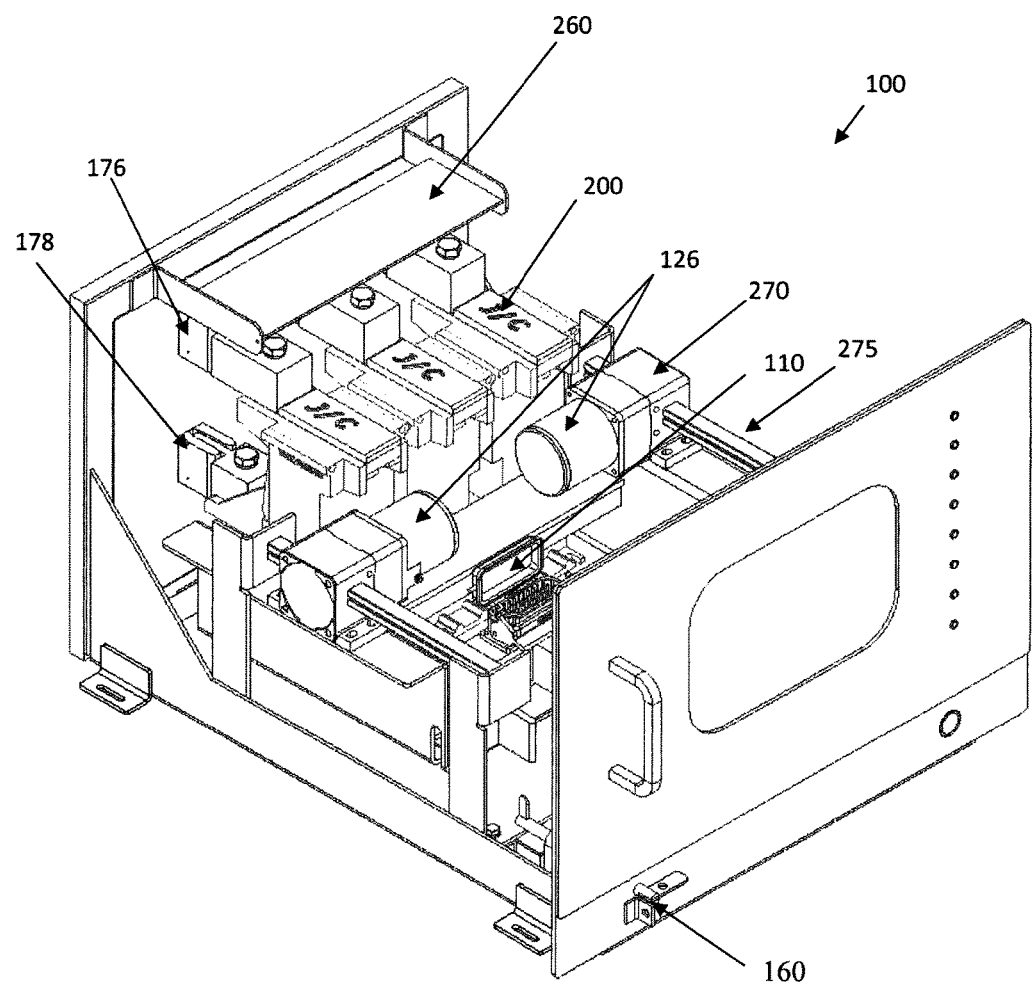
FIG. 13 is a left front perspective view of the motorized removable power cell according to another embodiment of the invention.

For example, FIG. 13 is a left front perspective view of another example of the motorized removable power cell. In the motorized removable power cell shown in FIG. 13, the motor assembly includes a left and a right motor 126 and left and right gear box 270. Like the embodiment shown in FIG. 1, the gear box contains the rack and pinion assembly and the limit switches. As previously described, the motors 126 are initialized by remote signaling via connector 110. The motors 126 are connected with left and right gear boxes 270 and travel along left and right tracks 275 that move the power connectors from the closed and energized position shown in FIG. 13, and an open and grounded position shown in FIG. 16. The movable components in this example can include the controller signal connector 110, the vacuum interrupters 200, the rear upper 177 (incoming) and lower (outgoing) 179 power blades, and corresponding upper and lower grounding blades 237.

Figure 14:
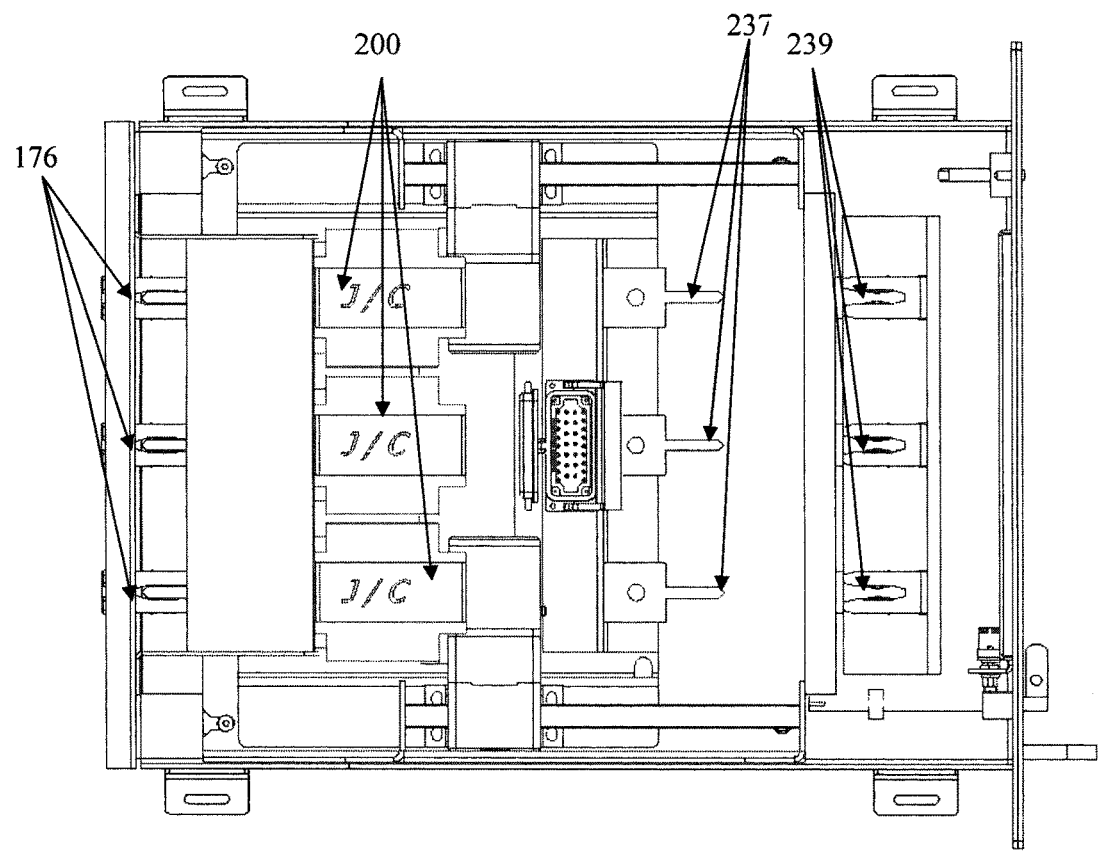
FIG. 14 is a top view of the motorized removable power cell closed and energized.

FIG. 14 is a top view of the motorized removable power cell closed and energized. In the example shown, stationary grounding multi-fork connectors 239 mate with moving grounding blades 237 when the motorized power cell is open and grounded. As described in the previous example, each gear box 270 includes limit switches to limit the travel across the tracks 275.

Figure 15:
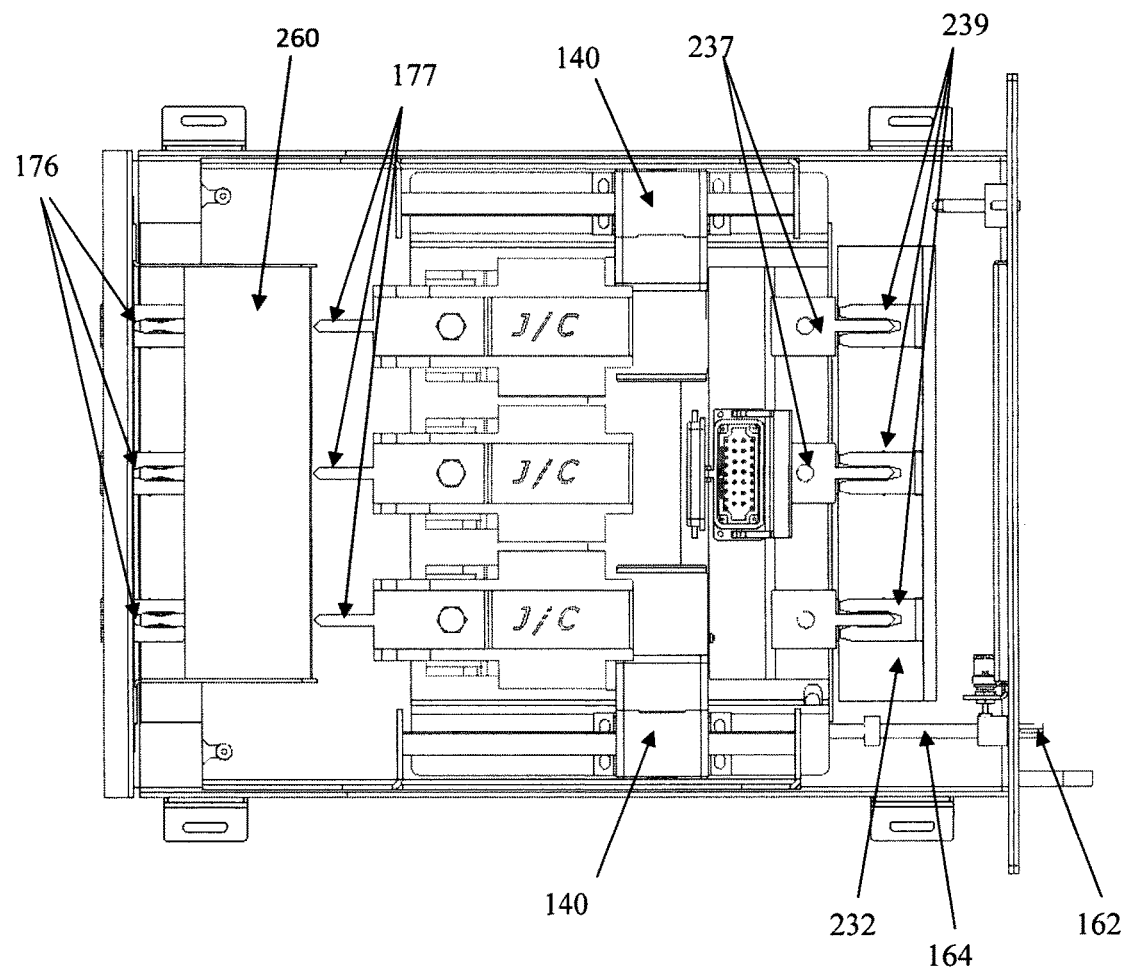
FIG. 15 is a top view of the motorized removable power cell open and grounded.
Figure 16:
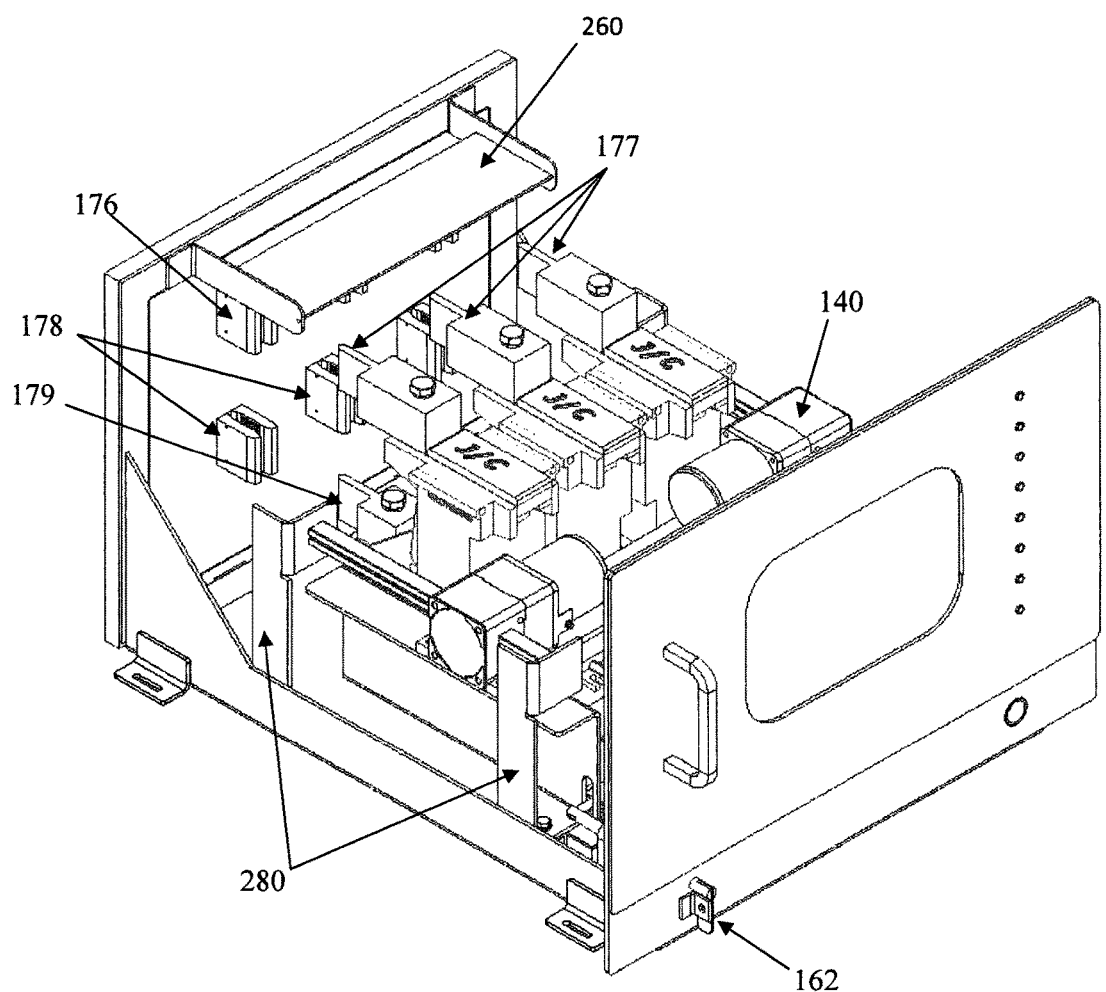
FIG. 16 is a left front perspective view of the motorized removable power cell shown in FIG. 15.

FIG. 15 is a top view of the motorized removable power cell open and grounded and FIG. 16 is a left front perspective view of the motorized removable power cell. The motorized switching assembly moves the incoming source contact blades and outgoing load contact blades from the closed and energized position to the open and grounded position shown in FIG. 15. Although the source incoming voltage has been disconnected from the vacuum interrupter 200, the source multi-fork connector continues to be energized. To prevent unintentional contact with the source incoming voltage, the shutter 260 rotates downward to provide a shield. In the example shown in FIG. 13, the front panel can be hinged (not shown) on one side to allow the power components to be removed and replaced as necessary.

Figure 9:
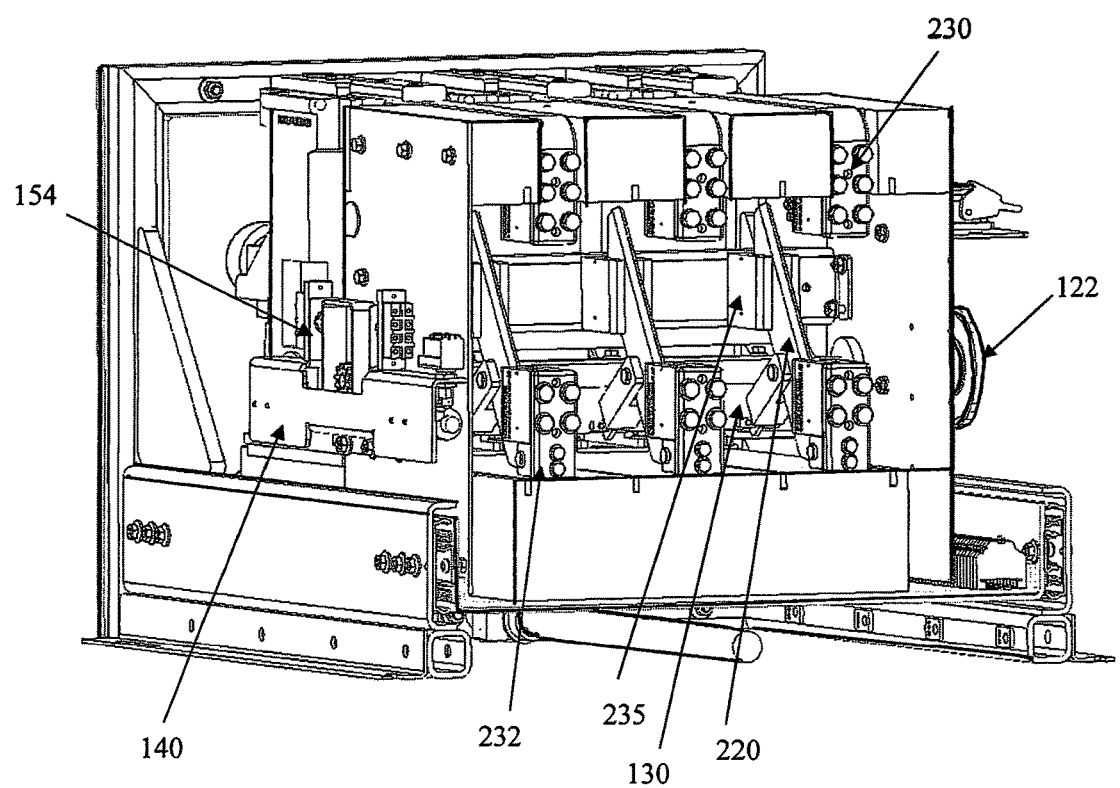
FIG. 9 is a left side section view showing the electro-mechanical operation of the visible disconnect switch blades.

As previously described in regard to FIG. 7 and FIG. 9, when the removable motorized power cell is in the open and grounded position, the outgoing load side connectors 178 is grounded.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A removable motor power cell comprising:
    a bolt-in assembly connected with an electrical enclosure;
    a motorized mechanical switching assembly attached to the bolt-in assembly to connect and disconnect electrical power to the electrical enclosure, the mechanical switching assembly including a rack and pinion switching assembly connected with a closed auxiliary limit switch and an open auxiliary limit switch and a lockout limit switch to control operation of the power switching assembly; and
    a power switching assembly attached to the bolt-in assembly and coupled with the motorized mechanical switching assembly to open and close a high voltage power isolation switch in one of an open and grounded position and a closed position, the motorized mechanical switching assembly controlling an operation of the high voltage power isolation switch.

2. The removable motor power cell of claim 1 wherein the power switching assembly comprises:
    motor driven switching assembly to automatically open and close the high voltage power isolation switch based on a position of the rack and pinion switching assembly.

3. The removable motor power cell of claim 1 wherein the power switching assembly comprises:
    an automatic power switching assembly attached to the bolt-in assembly and coupled with the mechanical switching assembly to open and close a high voltage isolation switch in one of an open and grounded position and a closed position.

4. The removable motor power cell of claim 1 wherein the power switching assembly comprises:
    a remote operated power switching assembly attached to the bolt-in assembly and coupled with the mechanical switching assembly to open and close a high voltage isolation switch in one of an open and grounded position and a closed position.

5. A motorized removable electrical power cell comprising:
    a power cell housing to removably attach to an enclosure frame assembly;
    an incoming electrical source connector and an outgoing electrical load connector on a back panel of the power cell housing, the outgoing electrical load connector electrically isolated from the incoming electrical source connector;
    an electro-mechanical switching assembly connected to a moving frame assembly, the electro-mechanical switching assembly including a rack and pinion switching assembly connected with a closed auxiliary limit switch and an open auxiliary limit switch and a lockout limit switch to control operation of the electro-mechanical switching assembly;
    a mating second incoming electrical source connector and a mating second outgoing electrical load connector connected to the moving frame assembly aligned to mate with the incoming electrical source connector and an outgoing electrical load connector on the back panel, the electro-mechanical switching assembly moving the frame assembly into a closed and energized position; and a controller to provide an input signal for controlling the operation of the electro-mechanical switching assembly to control an operation of the motorized removable electrical power cell.

6. The motorized removable electrical power cell of claim 5 further comprising:

a circuit interrupter connected to the moving frame assembly between the mating second incoming electrical source connector and the mating second outgoing electrical load connector.

7. The motorized removable electrical power cell of claim 5 wherein the electro-mechanical switching assembly comprises:

a motor connected with a gear box to move the moving frame assembly between the closed and energized position and an open and grounded position.

* * * * *